United States Patent
Radulescu

(10) Patent No.: US 9,973,216 B2
(45) Date of Patent: May 15, 2018

(54) EFFICIENT ERROR HANDLING ON A LINK USING ARQ AND MULTIPLE NACKS ASSOCIATED WITH MULTIPLE ERROR THRESHOLDS

(75) Inventor: Andrei Radulescu, Eindhoven (NL)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 1310 days.

(21) Appl. No.: 13/696,822

(22) PCT Filed: May 27, 2011

(86) PCT No.: PCT/EP2011/058763
§ 371 (c)(1),
(2), (4) Date: Nov. 8, 2012

(87) PCT Pub. No.: WO2012/000729
PCT Pub. Date: Jan. 5, 2012

(65) Prior Publication Data
US 2013/0061099 A1    Mar. 7, 2013

Related U.S. Application Data

(60) Provisional application No. 61/356,864, filed on Jun. 21, 2010.

(30) Foreign Application Priority Data

May 27, 2010   (EP) ..................... 10164182

(51) Int. Cl.
*H03M 13/00* (2006.01)
*H03M 13/29* (2006.01)
(Continued)

(52) U.S. Cl.
CPC .......... *H03M 13/29* (2013.01); *H04L 1/1858* (2013.01); *G11B 20/1833* (2013.01); *H03M 13/27* (2013.01)

(58) Field of Classification Search
CPC ... H04L 1/1809; H04L 1/1812; H04L 1/1887; H04L 1/1819; H04L 1/18; H04L 2001/0093; G11B 20/1833
(Continued)

(56) References Cited

U.S. PATENT DOCUMENTS 5,247,380 A * 9/1993 Lee .................... H04B 10/40
                                                    398/1
5,559,804 A * 9/1996 Amada ............. H04W 72/0406
                                                    370/311
(Continued)

FOREIGN PATENT DOCUMENTS

EP    1 507 369 A1    2/2005
GB    2 313 268 A     11/1997
(Continued)

OTHER PUBLICATIONS

International Search Report Issued in corresponding International application No. PCT/EP2011/058763, dated Oct. 26, 2011.
(Continued)

*Primary Examiner* — Albert Decady
*Assistant Examiner* — Osman M Alshack
(74) *Attorney, Agent, or Firm* — Patent Portfolio Builders PLLC

(57) ABSTRACT

The present invention describes how to handle errors occurring during communication in a frame-based communication system that uses a communication protocol having a first error handling mechanism responsive to receipt of an incorrect protocol symbol. The invention provides a method and apparatus that allow several errors to occur without the communication system responding by initiating the first error handling mechanisms. Under circumstances where errors occur, the method and apparatus may improve throughput.

9 Claims, 10 Drawing Sheets

(51) Int. Cl.
*H04L 1/18* (2006.01)
*H03M 13/27* (2006.01)
*G11B 20/18* (2006.01)

(58) Field of Classification Search
USPC ........ 714/746, 748, 749, 752, 753, 755, 758
See application file for complete search history.

(56) References Cited

U.S. PATENT DOCUMENTS

| | | | | |
|---|---|---|---|---|
| 5,717,762 | A * | 2/1998 | Aihara | H04K 1/00 370/350 |
| 6,035,432 | A * | 3/2000 | Jeddeloh | G11C 29/765 714/710 |
| 6,295,002 | B1 * | 9/2001 | Fukuda | G08B 29/181 340/531 |
| 6,335,933 | B1 * | 1/2002 | Mallory | H04L 1/1635 370/394 |
| 6,721,492 | B1 * | 4/2004 | Togashi | G11B 20/10 375/E7.239 |
| 7,035,214 | B1 * | 4/2006 | Seddigh et al. | 370/231 |
| 2001/0055311 | A1 * | 12/2001 | Trachewsky et al. | 370/445 |
| 2002/0154633 | A1 * | 10/2002 | Shin | H04L 47/10 370/389 |
| 2004/0141522 | A1 * | 7/2004 | Texerman | H04W 16/14 370/466 |
| 2008/0067637 | A1 * | 3/2008 | Voutilainen | 257/664 |
| 2008/0192705 | A1 * | 8/2008 | Suzuki | 370/335 |
| 2008/0195912 | A1 * | 8/2008 | Mende | H03M 13/09 714/752 |
| 2008/0273596 | A1 * | 11/2008 | Oguz | H04N 21/23424 375/240.13 |
| 2009/0172185 | A1 * | 7/2009 | Chandra | G06F 13/387 709/236 |
| 2009/0213938 | A1 * | 8/2009 | Lee | H04N 19/70 375/240.24 |
| 2009/0238553 | A1 * | 9/2009 | Tamura | G03B 17/14 396/296 |
| 2010/0049885 | A1 * | 2/2010 | Chandra | H04L 45/62 710/36 |
| 2010/0197248 | A1 * | 8/2010 | Balakrishnan | H04L 1/1877 455/101 |
| 2010/0203835 | A1 * | 8/2010 | Ryu | H04W 56/0015 455/41.2 |
| 2010/0318751 | A1 * | 12/2010 | Andreasen | 711/154 |
| 2011/0041025 | A1 * | 2/2011 | Van Den Hamer | H04L 1/004 714/749 |
| 2011/0078166 | A1 * | 3/2011 | Oliver | G06F 17/30864 707/760 |
| 2011/0078255 | A1 * | 3/2011 | Radulescu | H04L 67/14 709/206 |
| 2011/0078313 | A1 * | 3/2011 | Radulescu | H04L 45/125 709/227 |
| 2011/0134930 | A1 * | 6/2011 | McLaren | H04L 1/1614 370/401 |
| 2011/0138096 | A1 * | 6/2011 | Radulescu | G06F 13/385 710/305 |
| 2012/0072520 | A1 * | 3/2012 | Radulescu | H04L 69/16 709/206 |

FOREIGN PATENT DOCUMENTS

| | | | | |
|---|---|---|---|---|
| GB | | 2313268 A | * 11/1997 | .......... H04L 1/1692 |
| WO | | 2004/021658 A1 | 3/2004 | |
| WO | WO 2004021658 A1 | * 3/2004 | .......... G01S 13/878 | |

OTHER PUBLICATIONS

Written Opinion issued in corresponding International application No. PCT/EP2011/058763, completion date Oct. 26, 2011.
Gong, Fengmin et al., "An Application-Oriented Error Control Scheme for High Speed Networks," IEEE, ACM Transactions on Networking, New York, NY, US, vol. 4, No. 5, Oct. 1, 1996, pp. 669-683, XP011039017, ISSN: 1063-6692.
MIPI, "MIPI Alliance Standard for Unified Protocol (UniPro) Version 1.00.00—Aug. 25, 2007", Jan. 23, 2008.

* cited by examiner

EFFICIENT ERROR HANDLING ON A LINK USING ARQ AND MULTIPLE NACKS ASSOCIATED WITH MULTIPLE ERROR THRESHOLDS

The present invention relates to electronic multi-component systems, methods and devices providing optimized communication on a link with in-order data delivery.

BACKGROUND OF THE INVENTION

It is desirable in electronic multi-component systems that components used to build up the systems can be seamlessly integrated, thereby keeping the integration effort as low as possible, while at the same time having good performance. Ideally this should be the case independent of who the component manufacturer is. To form a standard, several manufacturers have formed a group which is called the Mobile Industry Processor Interface Alliance (MIPI®). The MIPI Alliance has agreed on a high-speed interface technology called UniPro[SM] which is for instance used for high speed communication between electronic components in mobile devices. In the future it will incorporate Phy symbol encoding which is available in D-Phy which is using 8b9b encoding as well as M-Phy that will be using 8b10b encoding.

In general UniPro[SM] is defined to be a general purpose protocol that deals with solutions of common issues like error handling, flow-control and routing or arbitration.

In the past and at present UniPro[SM] however provides a fairly complex error handling to ensure reliable communication. UniPro[SM] error handling is based on error detection using cyclic redundancy check (CRC), error reporting using Negative Acknowledgement Control (NAC) frames and data frame retransmissions in case of errors. Furthermore sequence numbers ensure that data frames are received in the proper order and prevent frames from being lost or duplicated. Sequence numbers are also used for management of a retransmission buffer on the transmitter side, assisting in removal of the frames from the retransmission buffer once they have been correctly received.

Further to the CRC error detection in UniPro[SM], timers are used to address error corner cases. At present, two timers are used to protect against the loss of frame acknowledgements and flow-control credits respectively.

When Phy-encoding is used, UniPro[SM] makes use of the Phy-specific error detection to trigger standard UniPro[SM] error recovery mechanism.

SUMMARY OF THE INVENTION

It is an object of the present invention to improve an error handling performance in a communication protocol.

A first aspect of the invention is a method for handling an error at a receiver in a communication system that uses a frame-based communication protocol having a first error handling mechanism (error recovery protocol) responsive to receipt of an incorrect or non-expected Phy and/or protocol symbol. The method comprises:
  receiving, via a receiver, a sequence of symbols and determining whether a count of incorrect or non-expected symbols in the sequence equals or exceeds a first error threshold greater than 1, and in the affirmative the receiver initiating the first error handling mechanism.

The receiver thus triggers the error recovery protocol (the error recovery protocol is initiated) when multiple incorrect or unexpected symbols are received within a sequence of symbols. A significant advantage of this method is that the first error recovery protocol is invoked less than it otherwise would. Known methods will employ the error recovery protocol in response to a single incorrect/non-expected symbol.

In some embodiments, wherein the first error handling mechanism involves the receiver sending a first Negative Acknowledgement Control (NAC) frame to a transmitter responsible for sending the sequence of symbols, the first NAC not requiring a re-synchronization between the transmitter and the receiver.

In some embodiments, the communication protocol also has a second error handling mechanism responsive to receipt of an incorrect or non-expected Phy and/or protocol symbol, and the method further comprises:
  determining whether a count of incorrect or non-expected symbols in the sequence equals or exceeds a second error threshold higher than the first error threshold, and in the affirmative the receiver initiating the second error handling mechanism.

This embodiment is advantageous because it causes the second error handling mechanism to be initiated only when the number of errors equals or exceeds the second error threshold, in a sense "postponing" it.

In some embodiments, the second error handling mechanism involves the receiver sending a second Negative Acknowledgement Control (NAC) frame to the transmitter responsible for sending the sequence of symbols, and that second NAC requires a re-synchronization between the transmitter and the receiver. This embodiment further illustrates the advantage of using a second threshold for a second error handling mechanism. In the case where the second error handling mechanism involves re-synchronization, the invention provides that this action is not taken until a higher number of errors have occurred. An example of a value of the second threshold could be 10 or 50 or 100, depending on the requirements in the given application/environment.

In some embodiments, the error handling mechanism is triggered if the sequence comprises two adjacent incorrect or non-expected symbols. This has turned out to improve error handling substantially, especially under more noisy conditions where electromagnetic interference (EMI) causes a significant number of errors. Triggering the error recovery protocol after three adjacent incorrect or non-expected symbols is advantageous for more efficiently handling serious errors. Adjacent errors could be indicative of something other than EMI, but if the problem is significant but intermittent, then an acceptance of multiple errors before invoking the error recovery protocol can improve performance significantly. Other values of the first threshold can be selected, for instance with the goal of optimizing the error handling in a certain application/environment.

In another embodiment, the count is determined in between a complete frame has been received and another one not yet begun. In between frames, more errors can be tolerated, and the invention can therefore adhere to standard error handling within frames and a less strict handling between frames. From a standards perspective, this is a very attractive embodiment feature.

In another embodiment, the sequence in which errors are counted is received after any outstanding frames have been completely received. In another embodiment the sequence of incorrect or non-expected symbols is received after a last symbol of a frame was received and before an ongoing frame is continued with a continuation-of-frame (COF) symbol. This particular embodiment specifically counts errors (in the sense of the invention) in ongoing frames.

The methods described above are highly relevant when the communication protocol is Unified Protocol, UniPro. In some embodiments, then, the error recovery protocol is an error recovery protocol in the sense of the UniPro standard. Other protocols, or developments of UniPro, are likely to be compatible with the present invention and thus the invention will be applicable for such protocols as well.

A second aspect of the invention provides a receiver symbol parser for use in a communication system that uses a frame-based communication protocol having a first error handling mechanism responsive to receipt of an incorrect or non-expected Phy and/or protocol symbol. The symbol parser is adapted to perform a method accordance in accordance with the first aspect of the invention. According to the second aspect of the invention, the receiver symbol parser is adapted to receive a sequence of symbols and determining whether a count of incorrect or non-expected symbols in the sequence equals or exceeds a first error threshold greater than 1, and in the affirmative initiating the first error handling mechanism.

The considerations related to the first aspect apply to the second aspect as well. For instance, in some embodiments of the second aspect, the communication protocol also has a second error handling mechanism responsive to receipt of an incorrect or non-expected Phy and/or protocol symbol, and the receiver symbol parser is further adapted to determine whether a count of incorrect or non-expected symbols in the sequence equals or exceeds a second error threshold higher than the first error threshold, and in the affirmative to initiate the second error handling mechanism.

A third aspect of the invention provides a receiver for use in a communication system that uses a frame-based communication protocol having an error handling mechanism responsive to receipt of an incorrect or non-expected Phy and/or protocol symbol. A receiver in accordance with this aspect employs a receiver symbol parser in accordance with the second aspect of the invention.

The considerations related to the first and second aspects apply to the third aspect as well.

BRIEF DESCRIPTION OF THE DRAWINGS

Below embodiments of the present invention are presented, with reference to the examples shown in drawings, wherein.

DESCRIPTION OF SELECTED EMBODIMENTS

Figure 1:
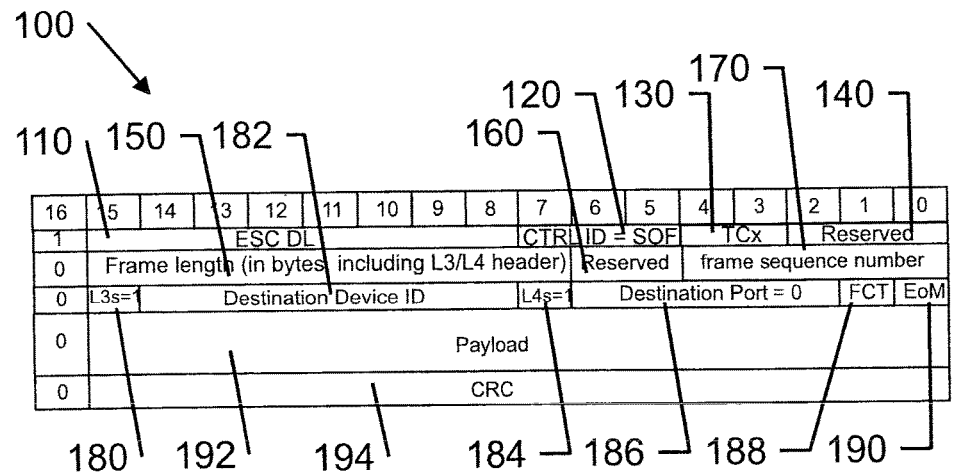
FIG. 1 shows an example of a length-based data format.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

As shown in FIG. 1 the data frame format based on frame length may be used in the UniPro$^{SM}$ version 1.5. Throughout the description of the drawings the same reference numerals are used for the same descriptive items and a redundant description thereof is omitted for the sake of efficiency.

Here the frame length is used instead of the EOF/EOF_PAD control symbol of a former frame format. The first two symbols and the last symbol of the UniPro$^{SM}$ data frame are the frame header and trailer respectively. The header consists of control symbol identified by the 16th bit with a value of 1 which has the following fields: an escape byte 110, which will be converted to an escape symbol in an encoded Phy, and denotes a control symbol, the control ID field CTRL_ID 120, which in the case of a data frame header has the value 0, denoted by SOF (Start of Frame), the traffic class TCx, 130, which may take the value of 0 and 1 at UniPro$^{SM}$ 1.5 and furthermore three reserved bits 140. The second header symbol is a data symbol identified by the 16$^{th}$ bit with a value of 0, which has the following fields: the frame length 150, the frame sequence number 170. The frame payload includes the Layers 3 and 4 headers (the L3s bit 180, the destination device ID 182, the L4s bit 184, the destination port 186, the FCT bit 188 and the EoM bit 190), and the payload 192. The frame trailer consists of the error check code 194.

Figure 2:
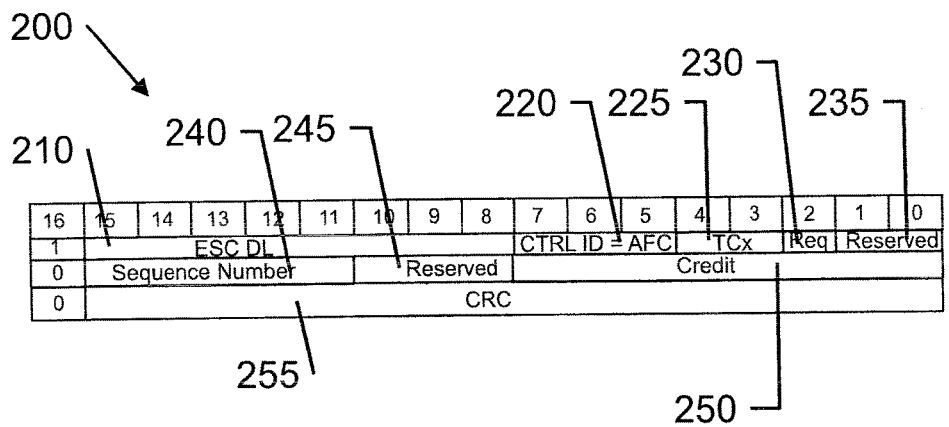
FIG. 2 shows an example of an acknowledgement and flow control frame.

FIG. 2 gives an example of an acknowledgement and flow control frame format 200. For instance, the Acknowledgement and Flow Control (AFC) frame consists of three symbols: The AFC control symbol where the 16th bit is 1 and two data symbols. The AFC control symbols consist of an escape byte 210, as for the SOF control symbol in the header, where the symbol control ID field 220, which has a value of 6 denoted by AFC, the traffic class TCx 225, for which UniPro$^{SM}$ 1.0 allows the values 0 and 1, a Req bit 235 used to request the peer side to send an AFC control frame at this traffic class, and two reserved bits 235. 240 denotes the frame sequence number, 245 is for reserved bits and 250 for flow control credits, whereas 255 denotes the cyclic redundancy check code.

Figure 3:
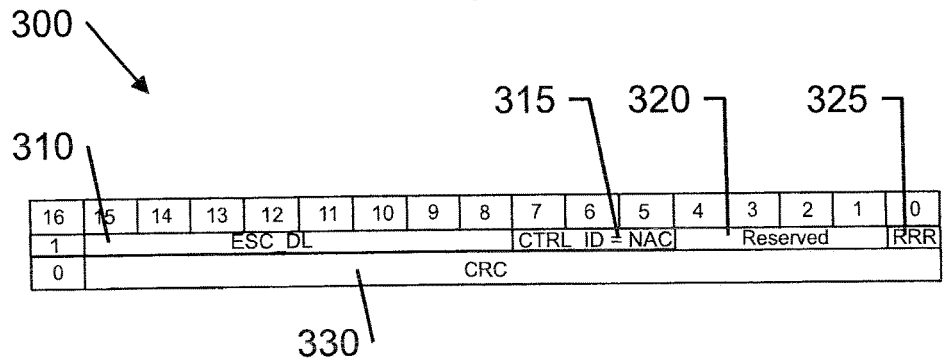
FIG. 3 shows an example of a negative acknowledgment control frame.

FIG. 3 gives an example of the frame format for a negative acknowledgement control frame 300. This NAC control frame for instance consists of two symbols: the NAC control symbol, where the 16th bit is 1, and one data symbol, the CRC is used for error detection. The NAC control symbol consists of: an escape byte 310, as for the SOF control symbol in the header, the symbol control ID field 315, which has the value of 5 denoted by NAC (negative acknowledgement), as well as four reserved bits 320 and an RRR bit 325 used to request the pier side to resynchronize the link.

Figure 4:
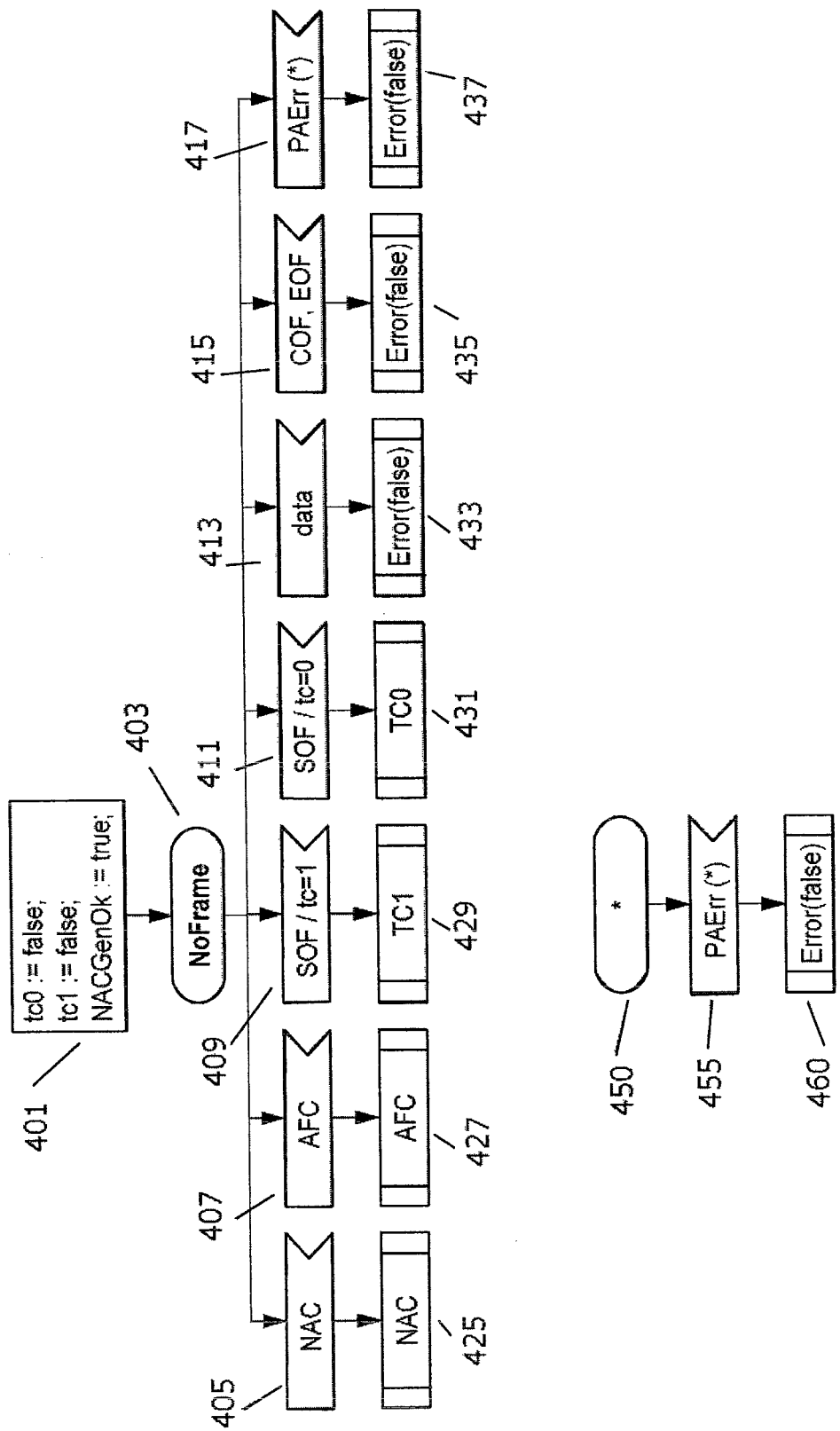
FIG. 4 shows an example of a common receiver symbol parser error detection.

FIG. 4 shows an example of a receiver symbol parser for error detection. Generally for instance the link error handling scheme of UniPro$^{SM}$ is based on error detection and data frame retransmission, and consists of two safety nets. The first safety net is acting quickly and handles typical errors, whereas the second safety net is slower and associated to the error handling of lost control frames. Generally UniPro$^{SM}$ adds a cyclic redundancy check error detection code CRC to each transmitted frame. The receiver re-computes the CRC and verifies it against the CRC that was received at the end of the frame. In case the received frame is correct the receiver commits it to the receive buffer and acknowledges the frame to the transmitter (for a data frame), or processes it (for a control frame). In case the receiver detects an error, this is reported back to the transmitter using an NAC frame.

Furthermore all transmitted data frames are assigned a sequence number, which is also transmitted in the data frame, and is used by the receiver as an assignment to identify the acknowledgement. For instance, the sequence number has 5 bits incremented with every frame and consequently wraps around at 31.

For instance, in UniPro$^{SM}$ a maximum of 16 frames can be transmitted without receiving an acknowledgement. Frame acknowledgement is performed using an ACK control frame. In case of an acknowledgement, a sequence number in the AFC frame acknowledges all unacknowledged data frames up to and including the one identified by the sequence number. The transmitter saves all the transmitted data frames in a retransmission buffer until they are acknowledged. If an NAC control frame is received, reporting an error, all the data frames in the retransmission buffer are retransmitted starting with the oldest unacknowledged frame.

The second safety net is used if control frames are lost. The consequence is a loss of either acknowledgement and/or link-level flow control credits contained in an AFC frame, or an error indication contained in an NAC frame. In order to handle such errors, which rarely occur, two timers are used for each traffic class: one for data, called replay timer, and one for credits, called credit timer. In case the replay timer expires, all the unacknowledged frames in that traffic class are retransmitted. In case the credit timer expires, an AFC frame with the Req bit set is sent for that traffic class. However, in both cases UniPro$^{SM}$ version 1.0 requires the link to be resynchronized. An NAC frame with the RRR bit is sent to also require the incoming link to be resynchronized, an activity that requires bandwidth and lowers the efficiency of the connection.

Apart from the CRC errors for instance numerous other errors may be detected in case of the first safety net by the receiver which errors can be: a receiver buffer overflow for instance due to a bit transmission error in the TCx field 130; an incoming frame having a larger length than the maximum frame size due to a transmission error changing the EOF control symbol into a valid data symbol; incorrect sequence number in a data frame; an AFC frame not followed by two data symbols; an NAC frame not followed by one data symbol; an EOF/EOF_PAD not followed by one data symbol; reception of a COF, EOF or EOF_PAD control symbol when no data frame has been started; reception of an SOF symbol when the data frame of the same traffic class is already ongoing and the data frame is not currently pre-empted; reception of an SOF symbol called TC0, in case a TC1 data frame is already ongoing; reception of a COF symbol during a data frame of a same traffic class, wherein the data frame has not been pre-empted; reception of a COF symbol continuing a data frame of a different traffic class; reception of an EOF, EOF_PAD or data symbol when the data frame is pre-empted and the pre-empted frame has finished; reception of a control symbol with invalid values for defined fields, for instance undefined CTRL_ID or TC; reception of an error indication from the Phy adapter.

In case of Phy-encoding the Phy adapter indicates an error for instance in the following cases:

a bad Phy symbol was received, a correct exception Phy symbol was received, but it is not mapped to a valid UniPro$^{SM}$ symbol, a correct exception Phy symbol was received immediately after another exception Phy symbol, when a data Phy symbol was expected, and an incorrect value or valid data Phy symbol is received following an ESC_PA.

In case of any of the above errors being detected, an NAC control frame is transmitted, which may be preceded by a pair of AFC control frames to prevent unnecessary retransmissions.

FIG. 4 gives an example of an embodiment of a part of the UniPro$^{SM}$ error handling mechanism.

A top level view of a symbol parser as it may be implemented in the receiver is described. The symbol parser maintains three variables tc0 and tc1 in case there is an ongoing data frame at traffic class TC0 and TC1 respectively, and a variable NACGenOk in order to indicate if the NAC generation is validated indicated by a true, or not, indicated by false as marked by reference sign 401.

As there is no ongoing data frame initially, hence TC0 and TC1 are both set to false. Also NAC generation is temporarily disabled after an error was reported with an NAC control frame until a frame with a good CRC is received. Initially there is no detected error and thus NACGenOk is set to true. As initially the symbol parser has not started any frame it may for instance wait in a state NoFrame indicated by reference sign 403. In the first line the start symbols are indicated 405 "NAC", 407 "AFC", 409 "SOF/TC=1", 411 "SOF/TC=0", 413 "DATA", 415 "COF,EOF" and 417 "PAErr" which call the respective procedures when received described below and connected by arrows respectively as indicated with reference signs from 425 to 437. If any other symbol is received, an error procedure is called with the parameter false. For any state, when an error indication is received from the Phy adapter, an error procedure is called with the parameter false as indicated by reference signs 450 to 460.

Figure 5:
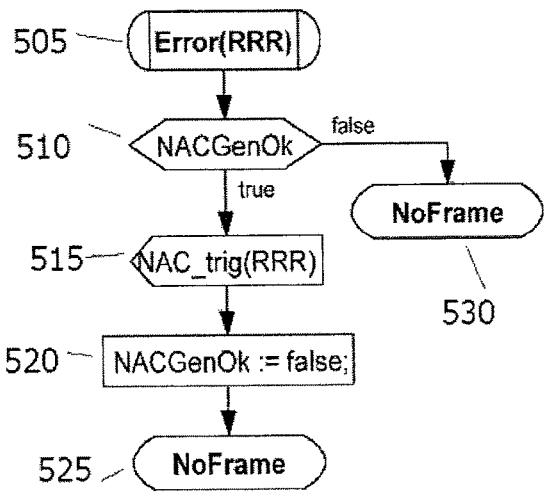
FIG. 5 shows an example of a procedure called following error detection.

FIG. 5 shows an error procedure. It takes a parameter RRR indicated by 505 and determines whether NAC generation is enabled (step 510). If this is not the case no NAC frame is generated, and the symbol parser returns to state NoFrame at 530. If NAC generation is enabled, an NAC frame is triggered at 515 and the NACGenOk value is set to false at 520. Then the symbol parser returns to state "NoFrame" at 525.

Figure 6:
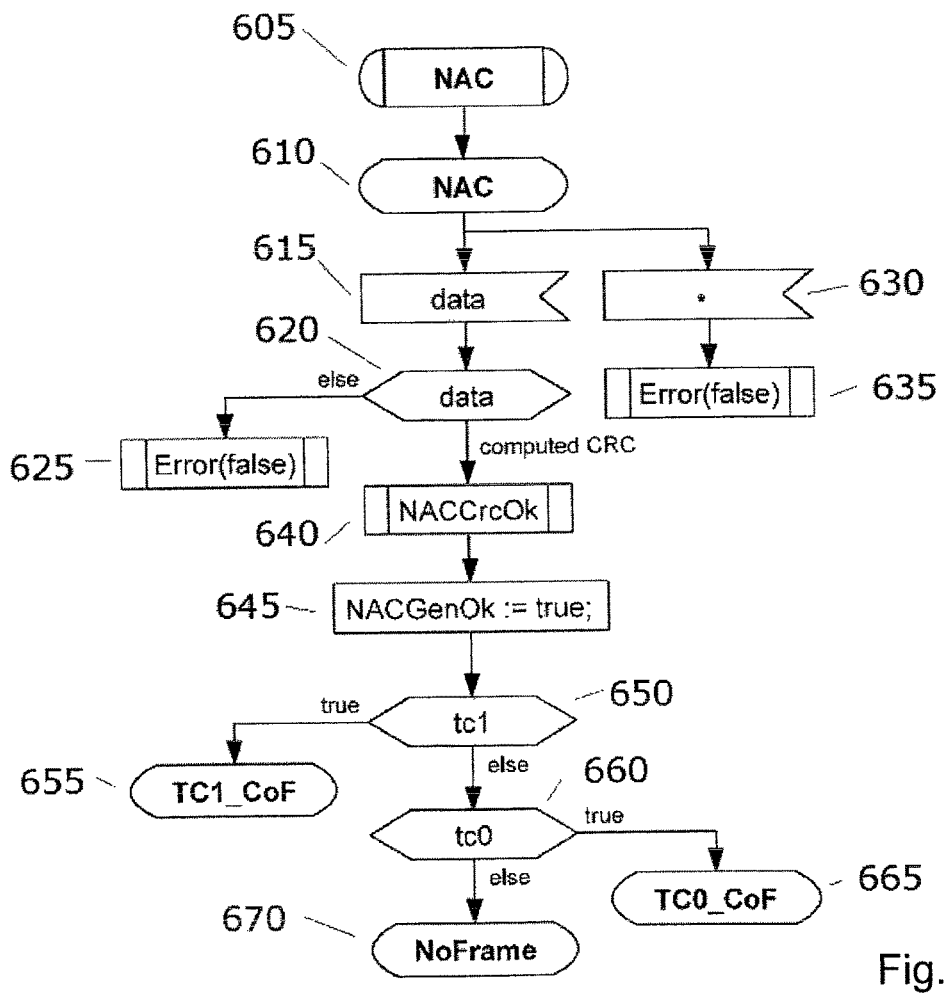
FIG. 6 shows an example of a procedure called when detecting the start of an NAC frame.

FIG. 6 shows an example of a procedure that is called when the start of an NAC frame is detected as indicated at 605. The procedure waits in a state 610 "NAC" until the data symbol, the CRC is received at 615. In case of another symbol being received at 630 an error routine is called at 635. If the computed CRC at 620 is not correct an error is as well reported at 625. If it is correct 640 the value of the parameter NACGen Ok is set to 2 at 645. Then at 650 the traffic class having a higher priority, TC1, is evaluated and in this case it is branched to the state of 655 "TC1_CoF" whereas on the other hand if this is not the case it is evaluated if the lower traffic class, TC0, is applicable at 660. If this is not the case the state of 670 "NoFrame" is assumed. On the other hand if TC0 is applicable the state 665 "TC0_CoF" is adopted.

Figure 7:
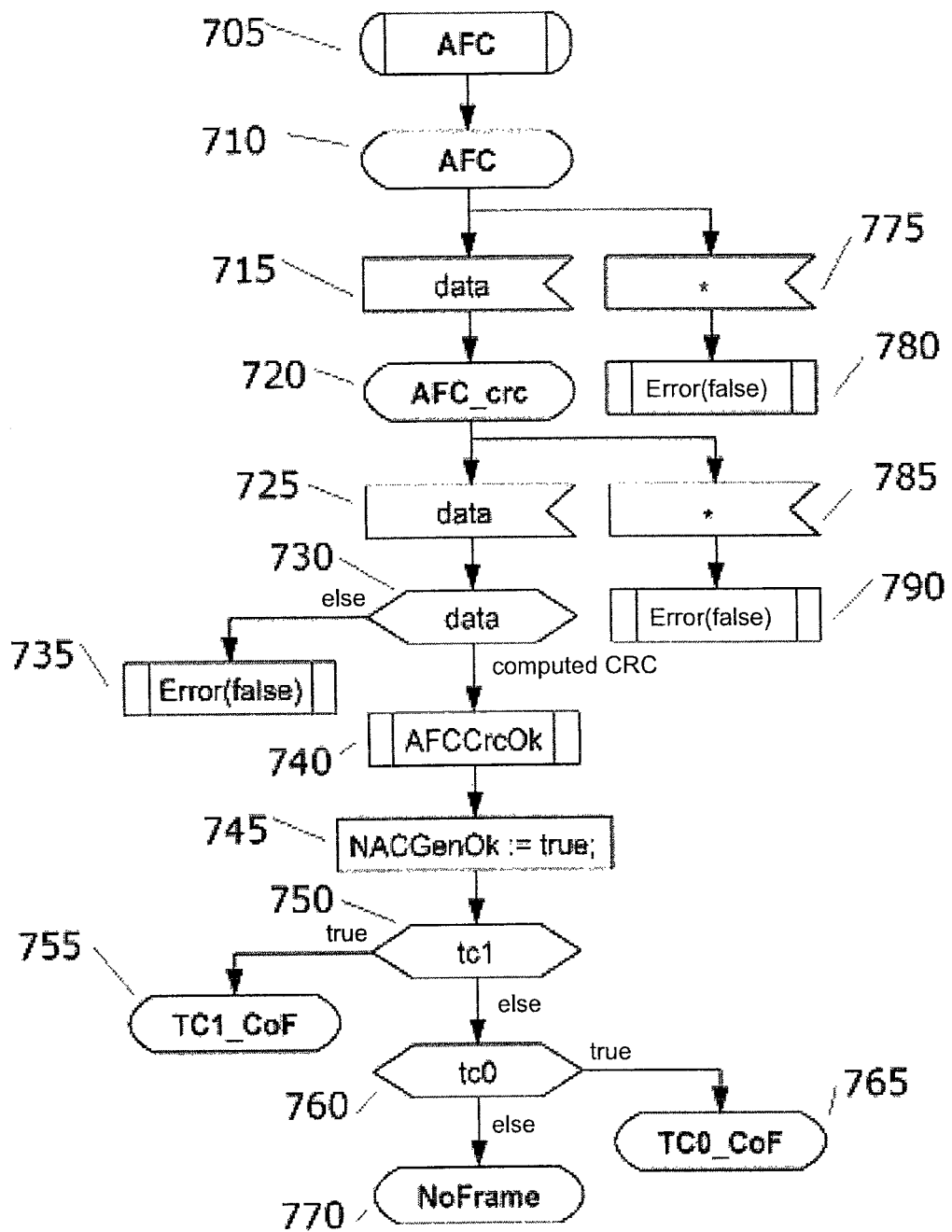
FIG. 7 presents an example of a procedure called when detecting the start of an AFC frame.

FIG. 7 gives an example of a procedure that for instance is called wherein, if the start of an AFC frame is detected in the beginning at 705 this procedure is called and transits into a state 710 "AFC" where it is waiting on the reception of data. In this case it is expecting the reception of the second data symbol of the AFC frame. In case another symbol is received at 775 an error routine is called at 780. If the correct symbol is received then the state 720 is assumed by the parser "AFC_crc". Again if any other symbol is received at 785 then an error routine is called at 790. If the second symbol a data symbol, which is actually the AFC frames' CRC then the data are verified and if they are correct the procedure 740, "AFC_crcOK" is called. Else the error procedure is called at 735. In case of a correct CRC computation and comparison result the AFC frame is committed with AFCcrcOK, where the proper actions following the AFC receipt are taken at 740. Following this activity, NACGenOk is set to true at 745 and then as explained at the previous figure the traffic classes are evaluated. Here the explanation for reference signs 750 to 770 are the same as the explanations given at FIG. 6 for reference signs 650 to 670.

Figure 8:
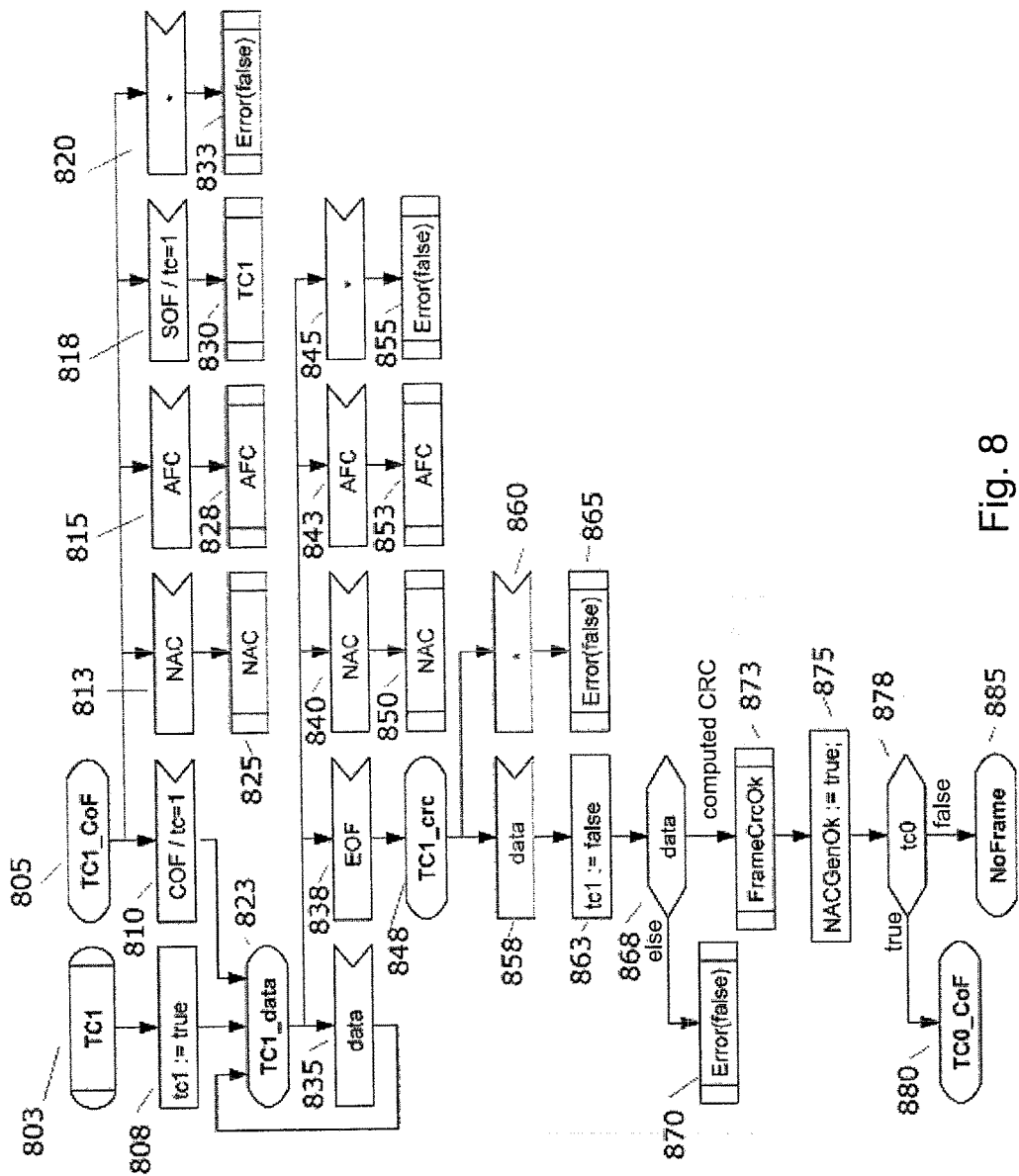
FIG. 8 shows an example of a procedure called when detecting the start of a data frame in traffic class 1,
FIG. 9 gives an example of a procedure called when detecting the start of a data frame on traffic class 0,
FIG. 10 gives a schematic example a receiver symbol parser that employs error handling according to the present invention,
FIG. 11 gives another schematic example of a receiver symbol parser that employs error handling according to the present invention.

FIG. 8 gives an example of a procedure called when detecting the start of a data frame associated to TC1. In this case after the parser receives an SOF symbol associated to the traffic class which is set to 1, the procedure for handling of the associated traffic class TC1 is called at 803. The procedure first sets the tc1 variable to true at 808 to indicate that a TCV1 frame has started, and then moves to state TC1_data at 823. In state 823 "TC1_DATA", the procedure is in the progress of receiving corresponding data symbols. While data is received at 835, two errors can occur which are not shown in the figure and relate to a buffer overflow and a frame exceeding the DL_MTU, which lead to the reporting of "Error". If no error occurred when processing the data symbol, the procedure returns to state TC1_data at 823. From the state 823 the frame can be ended with an EOF symbol or correspondingly with an EOF_PAD symbol, which is not shown here. After an EOF indicated by 838 a CRC is expected at 848. The frame is finished in which case TC1 becomes false at 863. The CRC is evaluated at 868 if any other symbol is received at 860 this is reported as an error at 865. The frame is committed in case the CRC check proves that at 868 otherwise an error is indicated at 870. In case of a correct error evaluation at 873 the variable NACGenOk is set to true at 875 then the TC0 data frame pre-emption is checked using tc0 at 878. If this is the case the TC0 data frame reception is continued in a state 880 "TC0_CoF". Otherwise the parser returns to the state 885 of "NoFrame". In case of NAC symbols 813, AFC symbols 815, SOF symbols 818 or wrong symbols 820 being received corresponding procedures 825 to 833 as indicated by the connecting arrows are called. If in the state 823 a pre-emption occurs due to receiving NAC or AFC symbols the corresponding procedures are called 840 causes 850 to be called and 843 causes 853 to be called as is the case for 840 and 850 as well as 845 and 855. Any other symbol received in the state 823 causes the report of an error. In case a TC1 data frame was pre-empted and the pre-empting frame is finished, the parser turns to the state 805 "TC1_CoF". In this state the frame can be continued while a CoF symbol is received with the TCx field set to 1 as indicated at 810, and leads to returning to the state 823. From state 805, another pre-emption may occur by an NAC or AFC symbol, associated to 813 and 815. Any other symbol will be reported under using the error procedure 833, or an SOF symbol with the TC field set to 1 can be received indicating potential retransmission.

Figure 9:
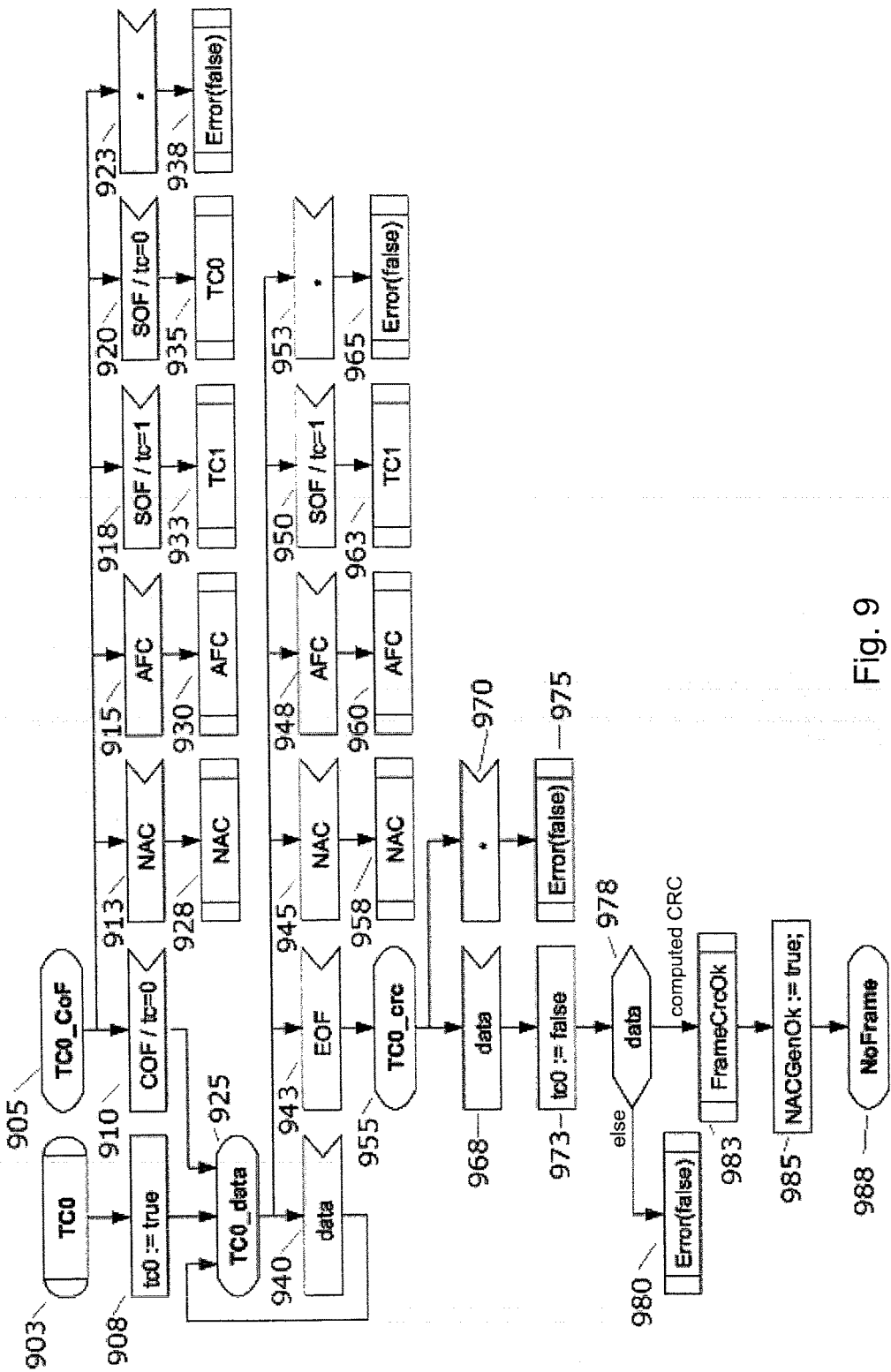

FIG. 9 shows a procedure that is called for instance when the start of data frame for traffic class 0 is detected. This procedure is very similar to the procedure for the higher traffic class TC1 apart from the evaluation for traffic class 0 at 878 and from there returning to the state 880. Consequently the description given for FIG. 8 applies with the exception, that wherever TC1 appears it should be replaced by the TC0 as the drawings are virtually identical apart from the different traffic classes that are handled a double description thereof is omitted for the sake of efficiency.

Here however TC0 frame may be pre-empted by a TC1 frame which is shown by allowing an SOF symbol with the TC field being set to 1 at 918 to be received during the pre-emption of the state 905 "TC0_CoF" or during the state 925 "TC0_DATA" where the SOF is indicated by 950. Secondly when the TC0 frame is finished the parser preferably always returns to the state 998 "NoFrame" as there is no other frame that can be continued contrary to the TC1 case, TC0 could be pre-empted, therefore a check is needed to determine if a TC0 frame needs to be continued in state 905 "TC0_CoF", or there is no ongoing frame in which case the parser returns to the state 988.

Figure 10:
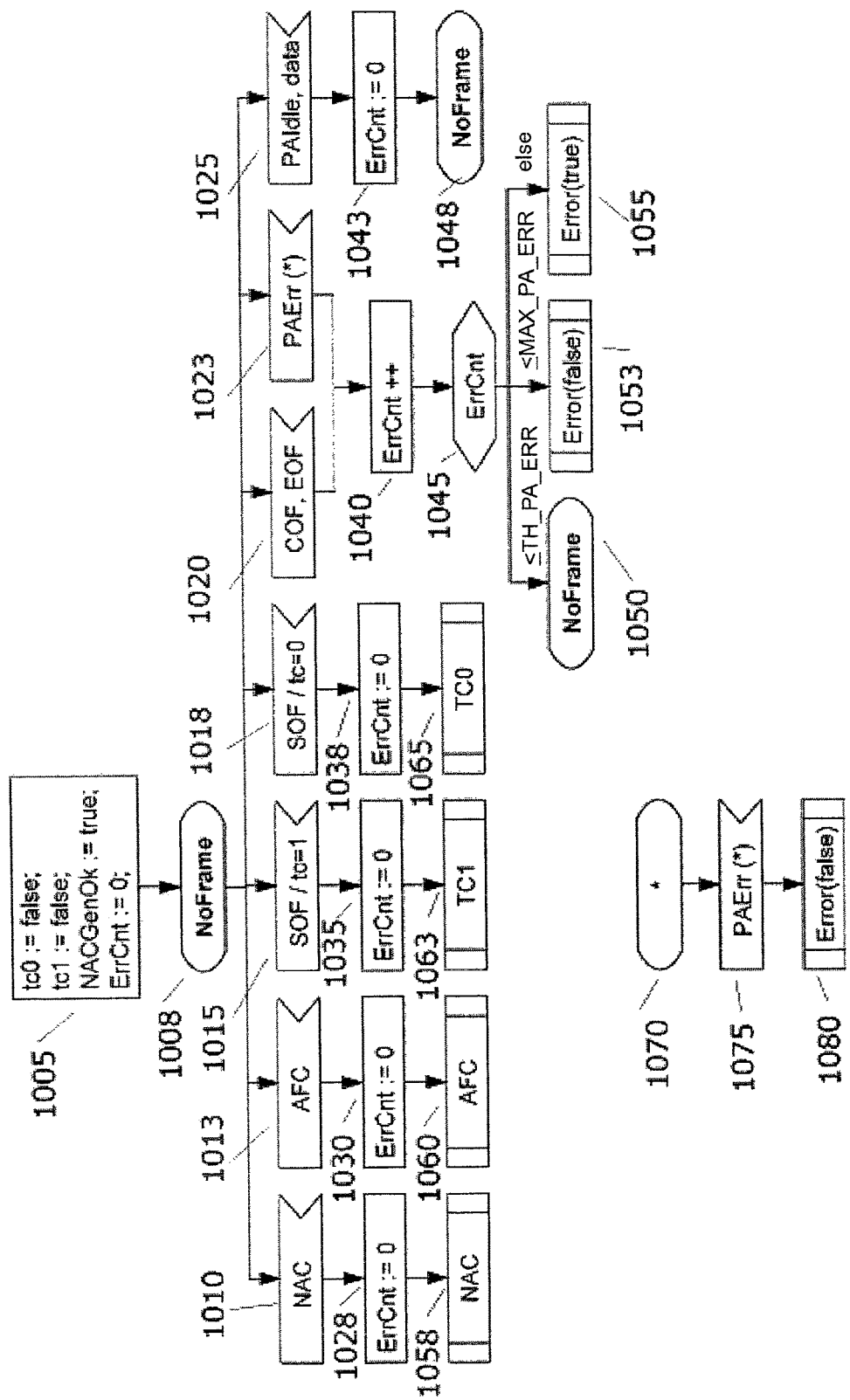

FIG. 10 schematically shows an example of a receiver symbol parser that employs error handling according to the present invention, which allows a data symbol and/or occasional errors in-between frames.

Allowing data symbols in-between frames is an advantageous alternative to sending IDLE symbols, which is good for EMI reasons, as it allows more randomness in the Phy symbol patterns, as opposed to a repetition creating unwanted spectral harmonics.

On the other hand preferably also occasional errors in-between frames may be ignored, as on the one hand they are likely not to be related to useful data. If on the other hand errors would hide a useful symbol, the UniPro$^{SM}$ error handling scheme would demonstrate to be robust enough to detect the error at a later detection stage. However, in most of the cases that were observed, the Phy transmission error does not need to be reported, and bandwidth and/or power use is thereby reduced.

Apart from the modifications this figure is directly comparable to the parser shown in FIG. 4 and explained there for instance box 401 compares to box 1005 whereas the first line from 1010 to 1023 compares to the first line of FIG. 4 from 405 to 417, concerning the received symbols. The last line from 425 to 431 directly compares to the boxes in FIG. 10 from 1058 to 1065 and therefore requires no additional comment or explanation. This also holds true for the flow shown from 450 to 460 which directly compares to the flow from 1070 to 1080.

The states "COF", "EOF", "PAErr", "PAIdle" and "DATA" indicated by 1020 to 1025 are handled in the state 1008 "NoFrame". I.e. in-between frames a counter 1040 "ErrCnt" is used to count errors in-between frames. When a frame started at 1010-1018, or when a "PAIdle" 1025 is received the "ErrCnt" 1043 is reset to 0 as shown from 1028 to 1038, if the Phy signals an error via "PAErr", 1023 the "ErrCnt" is incremented, and preferably if it reaches a first threshold TH_PA_ERR for instance like 3 a Phy resynchronization is triggered in using "Error (false)", 1053 if the error persists and ErrCnt reaches a second threshold an NAC frame requesting Phy resynchronization is triggered using "Error (true)" as shown in 1055.

This scheme can further be improved by allowing unexpected control symbols to be received like COF or EOF in-between frames, where the error counting is done as it is done for "PAErr" like shown at box 1020.

Typically PAErr indicates a decoding error issued by the Phy Adapter, and may e.g. consist of one of the following possible errors:

BAD_PHY_SYMBOL: An invalid Phy encoded symbol was received from the Phy. For Phy's using the 8b9b encoding (e.g., MIPI D-PHY) or 8b10b encoding (MIPI M-PHY), this means that an invalid 9-bit or 10-bit was received, respectively.

UNMAPPED_PHY_ESC_SYMBOL: A valid symbol according to the Phy encoding was received, however the symbol is used neither by the Phy nor by the protocol. Being unused, such a symbol is e.g. not transmitted, and, therefore, receiving one indicates a transmission error.

UNEXPECTED_PHY_ESC_SYMBOL: A valid and used Phy encoded symbol is received, however at an unexpected time. For UniPro v1.10, this means receiving C400, C417 or C600 as defined by the MIPI D-PHY for PA_PDU[7:0]-bits [7:0] in FIGS. 1-3.

BAD_PA_PARAM: For UniPro v1.10, this error indicates a Phy Adapter symbol (e.g. introduced by ESC_PA in bits [15:0] of a symbol, where the bit combination for bits [7:0] is invalid. This is conventionally the only detectable decoding error in the case of a Phy without symbol encoding.

As it is shown here both types of errors are combined.

Figure 13:
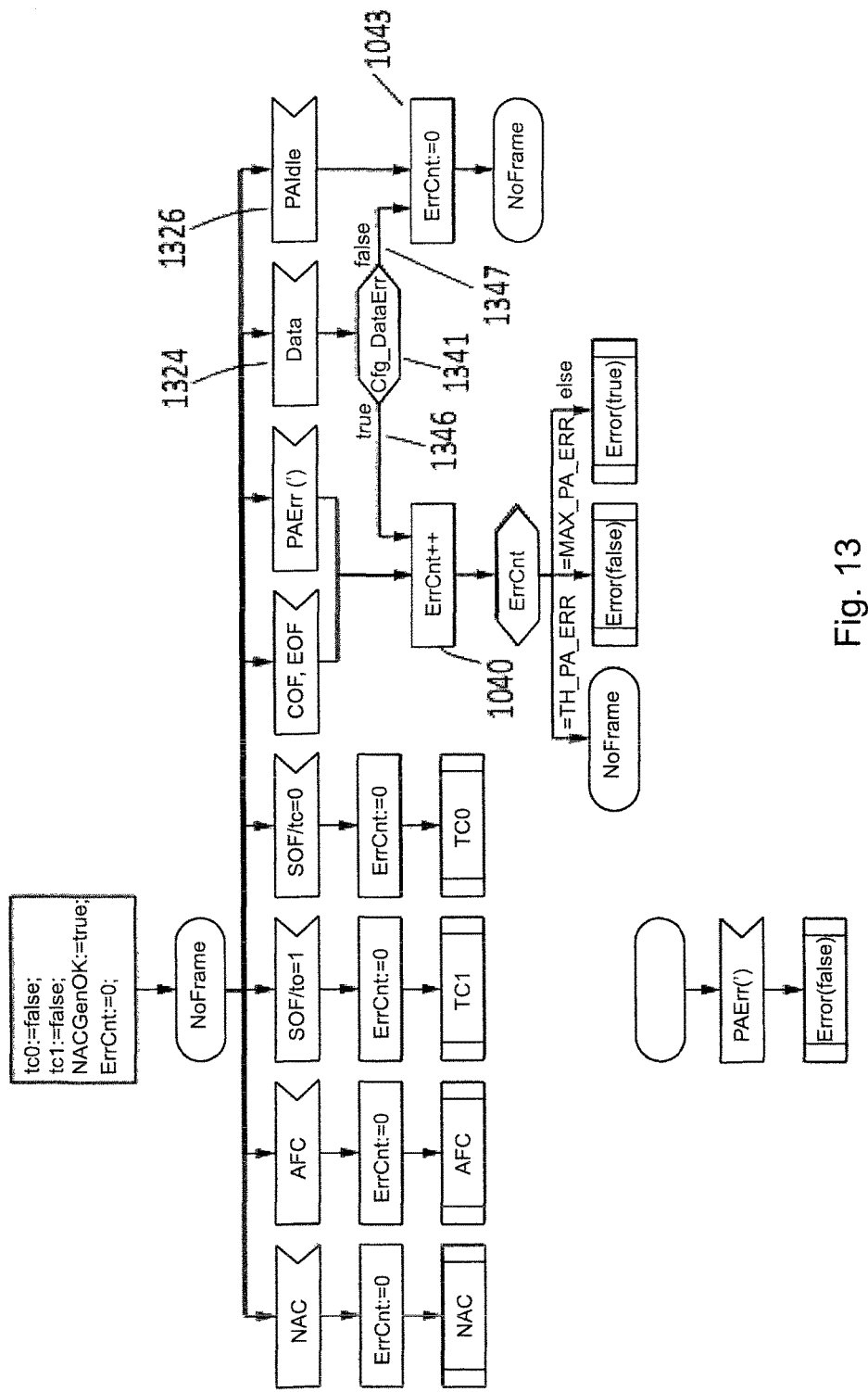
FIG. 13 shows another schematic example of a receiver symbol parser that employs error handling according to the present invention.

FIG. 13 schematically shows another receiver symbol parser that employs error handling in accordance with the invention. It is in many ways similar to the parser in FIG. 10. However, for further flexibility in the error handling and detection it may be desirable to allow data symbols (1324 in FIG. 13) to be received in-between frames for e.g. EMI reasons. If the system is configured by setting the Cfg_DataErr (1341 in FIG. 13) to false (1347 in FIG. 13) to accept data symbols in-between frames, the error counter is kept to 0 (1043 in FIG. 13) when such a data symbol is received in-between frames. These data symbols are simply introduced on purpose by the transmitter to preferably prevent the Phy from autonomously introducing IDLE symbols because of lack of data to be transmitted. If Cfg_DataErr is set to true (1346 in FIG. 13), meaning that data symbols should not be sent in-between frames, data symbols are treated like the other unexpected events in-between frames (PAErr, COF and EOF) by incrementing the ErrCnt (1040 in FIG. 13) and triggering NAC transmission without or with Phy resynchronization when ErrCnt excceeds TH_PA_ERR and MAX_PA_ERR, respectively. Since in this embodiment data and PAIdle are treated differently, element 1025 in FIG. 10 is substituted with element 1326, which deals with PAIdle, see FIG. 13.

The same mechanisms may also be applied in the same manner to the states "TC1_COF" and "TC0_COF", where UniPro$^{SM}$ is in-between frames during a pre-emption and expects a COF symbol. The difference to the above is that the COF and SOF symbols have opposite roles, as the COF symbol is an expected symbol and the SOF symbol is not. As can also be seen in FIG. 10 in the initialization of the procedure the ErrCnt is defined 0 as indicated in 1005 and the corresponding value is checked before calling up corresponding procedures in response to the reception of respective symbols as shown in 1028, 1030, 1035 and 1038.

Figure 11:
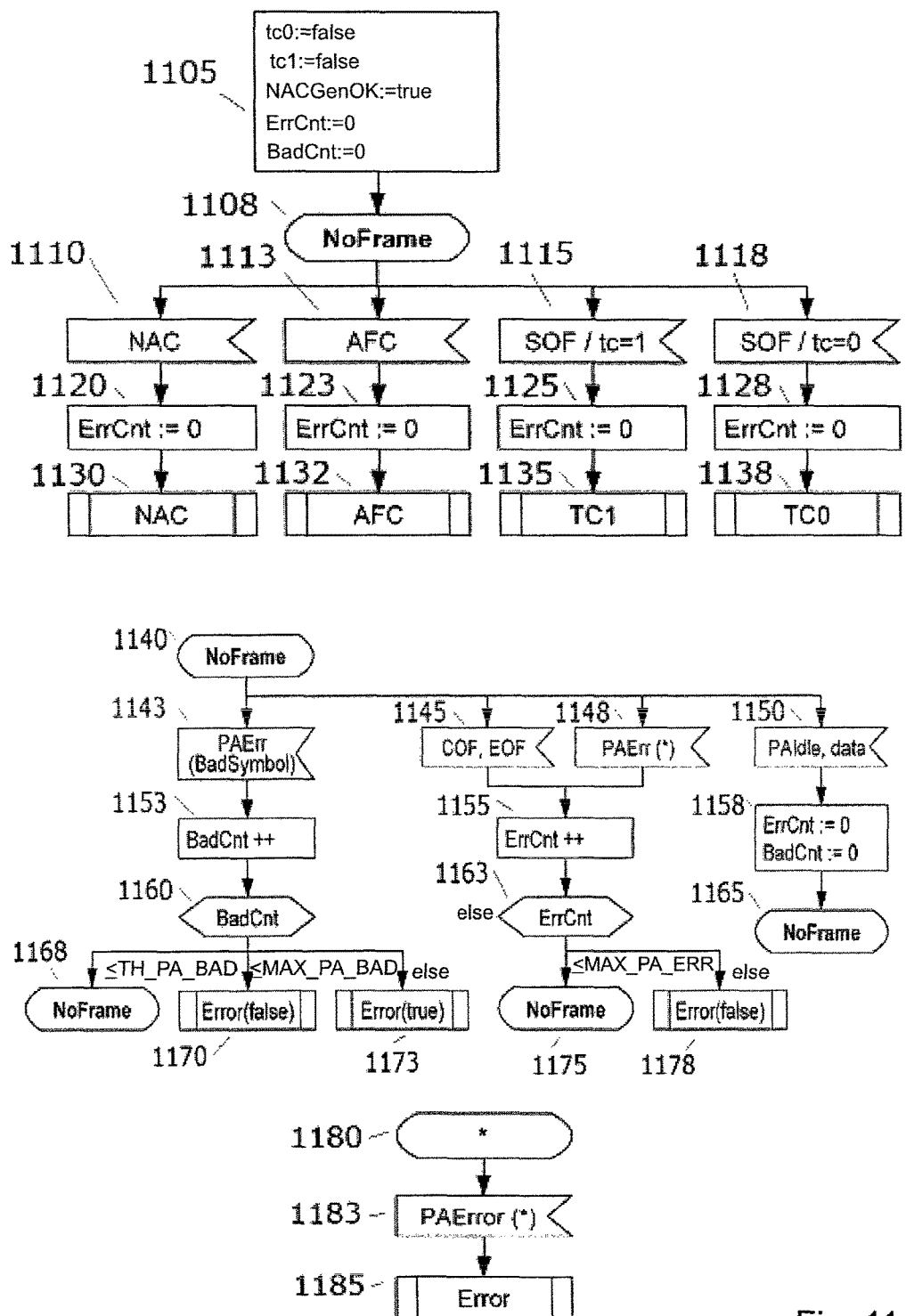

FIG. 11 schematically shows another example of an embodiment of a receiver symbol parser for error handling according to the present invention. Apart from box 1105, where a variable "BadCnt" is defined to 0 the figure is identical from 1110 to 1138 with FIG. 10 from 1010 to 1065. Therefore with this regard it requires no further explanation. This also holds true for the explanations regarding 1070 to 1080 which correspond to the reference numerals 1180 to 1185 in FIG. 11.

Contrary to the previous embodiment here the "PAErr" 1143 is defined in form of bad symbol error indications signalling a bad symbol and is treated differently from the other errors which are triggered by valid Phy symbols received when not expected. The bad Phy symbols are treated as before explained corresponding to FIG. 10 at reference signs 1040, 1045, 1050, 1053 and 1055. Herein states using a counter BadCnt and two thresholds TH_PA_BAD which may be for instance set to 3 and MAX_PA_BAD for instance 100 are used. In this embodiment other errors preferably are counted with the ErrCnts counter 1155 and when they reach a threshold MAX_PA_ERR, which for instance is set to 3 they trigger the transmission of an NAC frame without Phy resynchronization as shown with 1178. In this case no resynchronization is needed, because the received Phy symbols are valid. Also here like it was explained for the first embodiment a similar scheme can be applied for the states 1145 "TC1_CoF" and "TC0_CoF" for instance in-between frames during a pre-emption.

Figure 12:
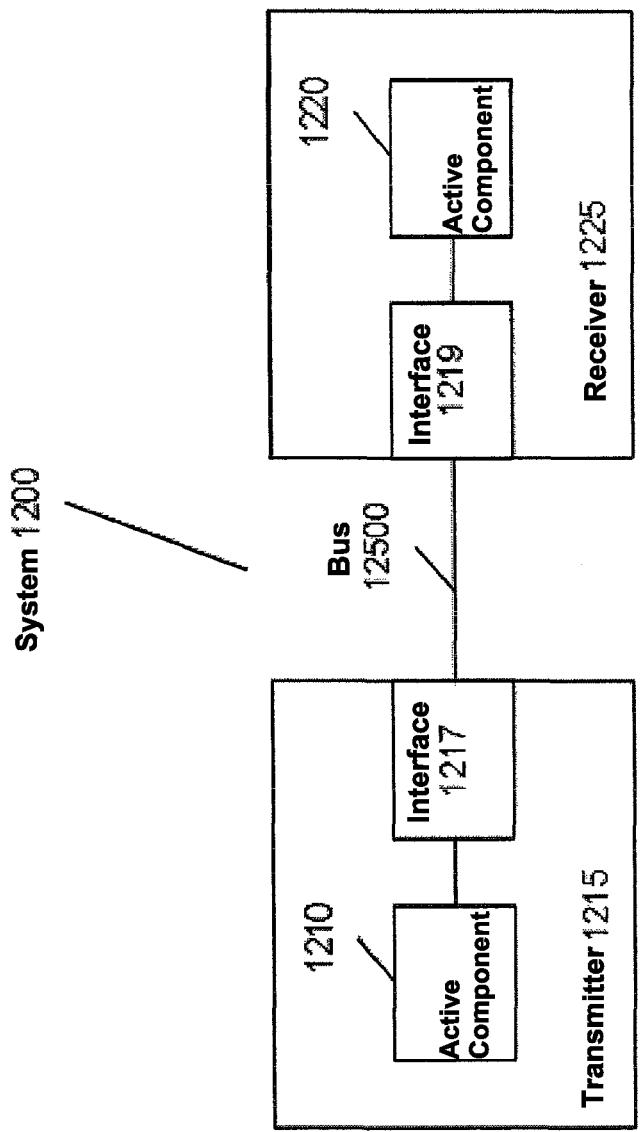
FIG. 12 shows a configuration of a transmitter and a receiver building up a system interconnected by a serial bus with in-order data delivery

Beneficially the invention may be applied to UniPro$^{SM}$ network-based products for use in mobile devices, such as mobile phones. FIG. 12 shows a configuration built from a transmitter 1215 and a receiver 1225 wherein this system is indicated by 1200. The receiver is in accordance with the invention and employs a receiver parser in accordance with the invention. The transmitter comprises an active component 1210 and a bus interface to a serial bus with in-order data delivery 1217. The bus itself is marked by 12500 and connects the transmitter 1215 and the receiver 1225 via their interfaces 1217 and 1219 the receiver is also shown to have an active device such as a processing unit indicated by 1220. For instance, the transmitter may comprise a processor 1210 that inserts valid data symbols via a data scheduler to the bus 12500, whereas the receiver may have a processor running the program for a receiver parser in the active component 1220.

The invention claimed is:

1. A method for handling an error at a receiver in a communication system, the communication system using a frame-based communication protocol, the method comprising:

receiving, from a transmitter via the receiver, wherein the transmitter and the receiver are both components of a same mobile device, a sequence of symbols;

determining a count of incorrect or non-expected Physical Layer (Phy) and/or protocol symbols in the sequence; and if the count equals or exceeds a first error threshold greater than 1, initiating a first error handling mechanism, and if the count equals or exceeds a second error threshold larger than the first error threshold, initiating a second error handling mechanism, wherein the first error handling mechanism involves the receiver sending a first Negative Acknowledgement Control (NAC) frame to the transmitter responsible for sending the sequence of symbols, the first NAC not requiring a re-synchronization between the transmitter and the receiver, and the second error handling mechanism involves the receiver sending a second NAC frame to the transmitter responsible for sending the sequence of symbols, the second NAC requiring a re-synchronization between the transmitter and the receiver, wherein the communication protocol is Unified Protocol, UniPro, and wherein a frame is a UniPro data frame or a UniPro control frame.

2. A method in accordance with claim 1, wherein the first error handling mechanism is initiated if the sequence comprises two adjacent incorrect or non-expected symbols.

3. A method in accordance with claim 1, wherein the first error handling mechanism is initiated if the sequence comprises three adjacent incorrect or non-expected symbols.

4. A method in accordance with claim 1, wherein the sequence of incorrect or non-expected symbols is received after any outstanding frames have been completely received.

5. A method in accordance with claim 1, wherein the sequence of incorrect or non-expected symbols is received after a last symbol of a frame was received and before an ongoing frame is continued with a continuation-of-frame symbol.

6. A receiver which includes
a receiver symbol parser for handling an error in a communication system that uses a frame-based communication protocol, wherein the receiver symbol parser is configured
to receive from a transmitter, the receiver and the transmitter being both components of a same mobile device, a sequence of symbols,
to determine a count of incorrect or non-expected Physical Layer (Phy) and/or protocol symbols in the sequence,
if the count exceeds a first error threshold greater than 1, to initiate a first error handling mechanism, and if the count equals or exceeds a second error threshold larger than the first error threshold, to initiate a second error handling mechanism, wherein the first error handling mechanism involves the receiver sending a first Negative Acknowledgement Control (NAC) frame to the transmitter responsible for sending the sequence of symbols, the first NAC not requiring a re-synchronization between the transmitter and the receiver, and the second error handling mechanism involves the receiver sending a second NAC frame to the transmitter responsible for sending the sequence of symbols, the second NAC requiring a re-synchronization between the transmitter and the receiver, wherein the communication protocol is Unified Protocol, UniPro, and wherein a frame is a UniPro data frame or a UniPro control frame.

7. A receiver in accordance to claim 6, wherein the receiver symbol parser initiates the first error handling mechanism if the sequence comprises two adjacent incorrect or non-expected symbols.

8. A receiver in accordance with claim 6, wherein the receiver symbol parser initiates the first error handling mechanism if the sequence comprises three adjacent incorrect or non-expected symbols.

9. A mobile device comprising:
a transmitter and
a receiver which includes
a receiver symbol parser for handling an error in a communication system that uses a frame-based communication protocol, wherein the receiver symbol parser is configured
to receive from the transmitter, the receiver and the transmitter being both components of a same mobile device, a sequence of symbols,
to determine a count of incorrect or non-expected Physical Layer (Phy) and/or protocol symbols in the sequence,
if the count exceeds a first error threshold greater than 1, to initiate a first error handling mechanism, and if the count equals or exceeds a second error threshold larger than the first error threshold, to initiate a second error handling mechanism, wherein the first error handling mechanism involves the receiver sending a first Negative Acknowledgement Control (NAC) frame to the transmitter responsible for sending the sequence of symbols, the first NAC not requiring a re-synchronization between the transmitter and the receiver, and the second error handling mechanism involves the receiver sending a second NAC frame to the transmitter responsible for sending the sequence of symbols, the second NAC requiring a re-synchronization between the transmitter and the receiver, wherein the communication protocol is Unified Protocol, UniPro, and wherein a frame is a UniPro data frame or a UniPro control frame.

* * * * *